(12) United States Patent
Larson et al.

(10) Patent No.: US 9,430,373 B2
(45) Date of Patent: *Aug. 30, 2016

(54) APPARATUS INCLUDING MEMORY CHANNEL CONTROL CIRCUIT AND RELATED METHODS FOR RELAYING COMMANDS TO LOGICAL UNITS

(71) Applicant: Micron Technology, Inc., Boise, ID (US)

(72) Inventors: Douglas A. Larson, Lakeville, MN (US); Jeffrey R. Brown, Minnetonka, MN (US)

(73) Assignee: Micron Technology, Inc., Boise, ID (US)

( * ) Notice: Subject to any disclaimer, the term of this patent is extended or adjusted under 35 U.S.C. 154(b) by 239 days.

This patent is subject to a terminal disclaimer.

(21) Appl. No.: 14/035,505

(22) Filed: Sep. 24, 2013

(65) Prior Publication Data

US 2014/0025876 A1    Jan. 23, 2014

Related U.S. Application Data

(63) Continuation of application No. 13/149,461, filed on May 31, 2011, now Pat. No. 8,543,758.

(51) Int. Cl.
*G06F 12/00* (2006.01)
*G06F 12/02* (2006.01)
(Continued)

(52) U.S. Cl.
CPC ......... *G06F 12/0246* (2013.01); *G06F 3/0613* (2013.01); *G06F 3/0659* (2013.01); *G06F 3/0679* (2013.01); *G11C 16/06* (2013.01); *G11C 16/349* (2013.01)

(58) Field of Classification Search
CPC . G11C 7/1078; G11C 7/1084; G11C 7/1072; G11C 11/4096; G11C 29/022; G11C 11/4093; G11C 29/1201; G11C 7/10; G11C 7/1006; G06F 12/0246; G06F 13/28; G06F 3/0613; G06F 3/0659; G06F 3/0679; G06F 17/5022; G06F 17/505; G06F 3/044; G06F 3/0617; G06F 3/0658; G06F 9/3869
USPC ......... 711/103, E12.008, E12.019, 114, 154, 711/167; 710/113, 25, 26, 317; 1/1
See application file for complete search history.

(56) References Cited

U.S. PATENT DOCUMENTS 5,802,343 A * 9/1998 Fandrich ............... G11C 16/16 365/218
6,654,848 B1   11/2003 Cleveland et al.
(Continued)

FOREIGN PATENT DOCUMENTS

CN   101861571   10/2010
JP   10-063442   6/1998
(Continued)

OTHER PUBLICATIONS

Supplementary European Search Report for related EP Patent Application No. 12793596.3, dated Jan. 20, 2015, 7 pages.
(Continued)

*Primary Examiner* — Mark Giardino, Jr.
*Assistant Examiner* — Edward Waddy, Jr.
(74) *Attorney, Agent, or Firm* — Brooks, Cameron & Huebsch, PLLC

(57) ABSTRACT

Memory system controllers can include a switch and non-volatile memory control circuitry coupled to the switch. The non-volatile memory control circuitry can include a channel control circuit coupled to logical units. The channel control circuitry can be configured to relay an erase command to a first one of the logical units and relay a particular command from the switch to a second one of the logical units while the erase command is being executed on the first one of the plurality of logical units.

16 Claims, 5 Drawing Sheets

(51) Int. Cl.
*G11C 16/06* (2006.01)
*G11C 16/34* (2006.01)
*G06F 3/06* (2006.01)

(56) References Cited

U.S. PATENT DOCUMENTS

| | | |
|---|---|---|
| 6,662,262 B1 | 12/2003 | Kasa et al. |
| 2005/0144516 A1 | 6/2005 | Gonzalez et al. |
| 2005/0198186 A1 | 9/2005 | Mor |
| 2006/0064560 A1* | 3/2006 | Mizuno ............... G06F 21/805 711/164 |
| 2008/0052449 A1* | 2/2008 | Kim .................... G06F 13/1678 711/103 |
| 2009/0125671 A1 | 5/2009 | Flynn et al. |
| 2009/0172257 A1* | 7/2009 | Prins et al. ................ 711/103 |
| 2009/0259808 A1* | 10/2009 | Koren ................. G11C 16/102 711/103 |
| 2009/0300259 A1 | 12/2009 | Luo et al. |
| 2010/0115172 A1* | 5/2010 | Gillingham et al. ........ 710/310 |
| 2010/0185808 A1* | 7/2010 | Yu et al. ..................... 711/103 |
| 2010/0262721 A1 | 10/2010 | Asnaashari et al. |
| 2011/0060869 A1 | 3/2011 | Schuette |
| 2011/0069526 A1* | 3/2011 | Schuette ............... G06F 3/0611 365/63 |
| 2011/0082963 A1 | 4/2011 | Jeddeloh |
| 2011/0213921 A1* | 9/2011 | Yu et al. ..................... 711/103 |
| 2012/0215958 A1* | 8/2012 | Fai et al. .................... 710/316 |

FOREIGN PATENT DOCUMENTS

| | | |
|---|---|---|
| JP | 2006-040026 A | 2/2006 |
| TW | I294081 | 3/2008 |
| WO | 2009064793 | 5/2009 |
| WO | 2010080142 | 7/2010 |
| WO | 2010117404 | 10/2010 |

OTHER PUBLICATIONS

Notice of Rejection for related Japan Patent Application No. 2014-513587, dated Dec. 2, 2014, 12 pages.
Office Action for related Taiwan Patent Application No. 101119409, dated Jul. 28, 2014, 12 pages.
U.S. Appl. No. 13/149,447, filed May 31, 2011 (40 pages).
U.S. Appl. No. 13/149,488, filed May 31, 2011 (42 pages).
U.S. Appl. No. 13/149,467, filed May 31, 2011 (39 pages).
U.S. Appl. No. 13/149,457, filed May 31, 2011 (41 pages).
U.S. Appl. No. 13/149,498, filed May 31, 2011 (40 pages).
U.S. Appl. No. 13/149,518, filed May 31, 2011 (42 pages).
International Search Report and Written Opinion for related PCT Application No. PCT/US2012/039364, mailed Nov. 28, 2012, (8 pgs.).
Office Action for related China Patent Application No. 201280033939.7, dated Jul. 27, 2015, 23 pages.
Communication Pursuant to Article 94(3) EPC for related EP Patent Application No. 12793596.3, dated May 4, 2016, 6 pages.
Office Action for related China Patent Application No. 201280033939.7, dated Apr. 6, 2016, 16 pages.

\* cited by examiner

APPARATUS INCLUDING MEMORY CHANNEL CONTROL CIRCUIT AND RELATED METHODS FOR RELAYING COMMANDS TO LOGICAL UNITS

PRIORITY APPLICATION INFORMATION

This application is a Continuation of U.S. application Ser. No. 13/149,461, filed May 31, 2011, issued as U.S. Pat. No. 8,543,758 on Sep. 24, 2013, which is incorporated herein by reference.

TECHNICAL FIELD

The present disclosure relates generally to apparatus, such as semiconductor memory devices, systems, and controllers, and related methods, and more particularly, to memory system controllers, for example.

BACKGROUND

Memory devices are typically provided as internal, semiconductor, integrated circuits in computers or other electronic devices. There are many different types of memory including volatile and non-volatile memory. Volatile memory can require power to maintain its information, e.g., data, and includes random-access memory (RAM), dynamic random access memory (DRAM), synchronous dynamic random access memory (SDRAM), and static random access memory (SRAM) among others. Non-volatile memory can provide persistent information by retaining stored information when not powered and can include NAND flash memory, NOR flash memory, read only memory (ROM), Electrically Erasable Programmable ROM (EEPROM), Erasable Programmable ROM (EPROM), and phase change random access memory (PCRAM), among others.

Memory devices can be combined together to form a solid state drive (SSD). A solid state drive can include non-volatile memory, e.g., NAND flash memory and NOR flash memory, and/or can include volatile memory, e.g., DRAM and SRAM, among various other types of non-volatile and volatile memory. Flash memory devices, including floating gate flash devices and charge trap flash (CTF) devices using semiconductor-oxide-nitride-oxide-semiconductor and metal-oxide-nitride-oxide-semiconductor capacitor structures that store information in charge traps in the nitride layer, may be utilized as non-volatile memory for a wide range of electronic applications. Flash memory devices typically use a one-transistor memory cell that allows for high memory densities, high reliability, and low power consumption.

An SSD can be used to replace hard disk drives as the main storage device for a computing system, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

An SSD can include a number of memory devices, e.g., a number of memory chips (as used herein, "a number of" something can refer to one or more of such things, e.g., a number of memory devices Can refer to one or more memory devices). As one of ordinary skill in the art will appreciate, a memory chip can include a number of dies and/or logical units (LUNs), e.g., where a LUN can be one or more die. Each die can include a number of memory arrays and peripheral circuitry thereon. The memory arrays can include a number of memory cells organized into a number of physical pages, and the physical pages can be organized into a number of blocks. An array of flash memory cells can be programmed a page at a time and erased a block at a time. SSD controllers may use an embedded processor to perform memory management and allocation.

DETAILED DESCRIPTION

Figure 1:
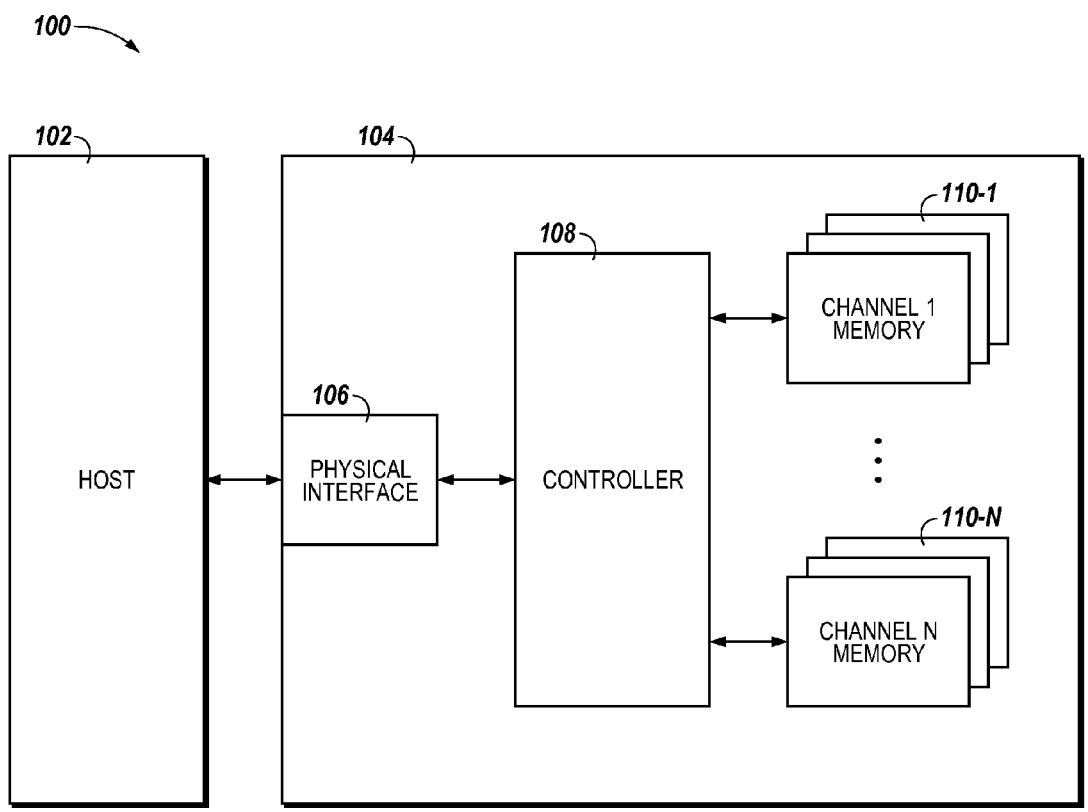
FIG. 1 is a functional block diagram of a computing system including at least one memory system in accordance with a number of embodiments of the present disclosure.

The present disclosure includes memory system controllers. Memory system controllers can include a switch and non-volatile memory control circuitry coupled to the switch. The non-volatile memory control circuitry can include a channel control circuit coupled to logical units. The channel control circuitry can be configured to relay an erase command to a first one of the logical units and relay a particular command from the switch to a second one of the logical units while the erase command is being executed on the first one of the plurality of logical units.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N," particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate the embodiments of the present invention, and should not be taken in a limiting sense.

FIG. 1 is a functional block diagram of a computing system 100 including at least one memory system 104 in accordance with a number of embodiments of the present disclosure. In the embodiment illustrated in FIG. 1, the memory system 104, e.g., a solid state drive (SSD), can include a physical host interface 106, a memory system controller 108, e.g., an SSD controller, and a number of solid state memory devices 110-1, . . . , 110-N. The solid state memory devices 110-1, . . . , 110-N can provide a storage volume for the memory system. In a number of embodiments, the solid state memory system controller 108 can be an application specific integrated circuit (ASIC), where the controller 108, e.g., in the form of an ASIC, is coupled to a printed circuit board including the physical interface 106 and solid state memory devices 110-1, . . . , 110-N.

As illustrated in FIG. 1, the memory system controller 108, e.g., a solid state memory system controller, can be coupled to the physical host interface 106 and to the solid state memory devices 110-1, . . . , 110-N. The physical host interface 106 can be used to communicate information between the memory system 104 and another device such as a host 102. Host 102 can include a memory access device, e.g., a processor. One of ordinary skill in the art will appreciate that "a processor" can intend a number of processors, such as a parallel processing system, a number of coprocessors, etc. Example hosts include laptop computers, personal computers, digital cameras, digital recording and playback devices, mobile telephones, PDAs, memory card readers, interface hubs, and the like. For a number of embodiments, the physical host interface 106 can be in the form of a standardized physical interface. For example, when the memory system 104 is used for information storage in a computing system 100, the physical host interface 106 can be a serial advanced technology attachment (SATA) physical interface, a peripheral component interconnect express (PCIe) physical interface, a small computer system interface (SCSI) interface, a serial attachment SCSI (SAS) interface, or a universal serial bus (USB) physical interface, among other interfaces. In general, however, the physical host interface 106 can provide an interface for passing control, address, information, e.g., data, and other signals between the memory system 104 and a host 102 having compatible receptors for the physical host interface 106.

The solid state memory system controller 108 can communicate with the solid state memory devices 110-1, . . . , 110-N to read, write, and erase information, among other operations. The solid state memory system controller 108 can have firmware and/or circuitry that may be a number of integrated circuits and/or discrete components. For a number of embodiments, the circuitry in solid state memory system controller 108 may include control circuitry for controlling access across the solid state memory devices 110-1, . . . , 110-N and circuitry for providing a translation layer between a host 102 and the memory system 104. Thus, a memory controller could selectively couple an I/O connection (not shown in FIG. 1) of a solid state memory device 110-1, . . . , 110-N to receive the appropriate signal at the appropriate I/O connection at the appropriate time. Similarly, the communication protocol between a host 102 and the memory system 104 may be different than what is required for access of a solid state memory device 110-1, . . . , 110-N. Solid state memory system controller 108 could then translate the commands received from the host 102 into the appropriate commands to achieve the desired access to a solid state memory device 110-1, . . . , 110-N.

A solid state memory device 110-1, . . . , 110-N can include a number of arrays of memory cells, e.g., non-volatile memory cells. The arrays can be flash arrays with a NAND architecture, for example. In a NAND architecture, the control gates of memory cells of a "row" can be coupled with an access, e.g., word, line, while the memory cells can be coupled in series source to drain in a "string" between a select gate source transistor and a select gate drain transistor. The string can be connected to a data, e.g., bit, line by the select gate drain transistor. The use of the terms "row" and "string" implies neither a linear nor an orthogonal arrangement of memory cells. As will be appreciated by those of ordinary skill in the art, the manner of connection of the memory cells to the bit lines and source lines depends on whether the array is a NAND architecture, a NOR architecture, or some other memory array architecture.

The solid state memory devices 110-1, . . . , 110-N can include a number of memory cells that can be grouped. As used herein, a group can include a number of memory cells, such as a page, block, plane, die, an entire array, or other groups of memory cells. For example, some memory arrays can include a number of pages of memory cells that make up a block of memory cells. A number of blocks can be included in a plane of memory cells. A number of planes of memory cells can be included one a die. As an example, a 128 GB memory device can include 4320 bytes of information per page, 128 pages per block, 2048 blocks per plane, and 16 planes per device.

The memory system 104 can implement wear leveling, e.g., garbage collection and/or reclamation, to control the wear rate on the solid state memory devices 110-1, . . . , 110-N. A solid state memory array can experience errors, e.g., failures, after a number of program and/or erase cycles. Wear leveling can reduce the number of program and/or erase cycles performed on a particular group by spreading the cycles more evenly over the entire array. Wear leveling can include dynamic wear leveling to minimize the amount of valid blocks moved to reclaim a block. Dynamic wear leveling can include a technique called garbage collection. Garbage collection can include reclaiming, e.g., erasing and making available for writing, blocks that have the most invalid pages, e.g., according to a "greedy algorithm." Alternatively, garbage collection can include reclaiming blocks with more than a threshold amount of invalid pages. If sufficient free blocks exist for a writing operation, then a garbage collection operation may not occur. An invalid page, for example, can be a page of information that has been updated to a different page. Static wear leveling includes writing static information to blocks that have high erase counts to prolong the life of the block.

Write amplification is a process that may occur when writing information to solid state memory devices 110-1, . . . , 110-N. When randomly writing information in a memory array, the solid state memory system controller 108 scans for available space in the array. Available space in a memory array can be individual cells, pages, and/or blocks of memory cells that are not storing information and/or have been erased. If there is enough available space to write the information in a selected location, then the information is written to the selected location of the memory array. If there is not enough available space in the selected location, the information in the memory array is rearranged by reading, copying, moving, or otherwise rewriting and erasing the information that is already present in the selected location to a new location, leaving available space for the new information that is to be written in the selected location. The rearranging of old information in the memory array is called write amplification because the amount of writing performed by the memory device is amplified over an amount of writing that would occur if there were sufficient available space in the selected location.

The computing system 100 illustrated in FIG. 1 can include additional circuitry beyond what is illustrated. The detail of the computing system 100 illustrated in FIG. 1 has been reduced so as not to obscure embodiments of the present disclosure. For example, the memory system 104 can include address circuitry to latch address signals provided over I/O connections through I/O circuitry. Address signals can be received and decoded by a row decoder and a column decoder to access the solid state memory devices 110-1, . . . , 110-N. It will be appreciated by those skilled in the art that the number of address input connections can depend on the density and architecture of the solid state memory devices 110-1, . . . , 110-N.

Figure 2:
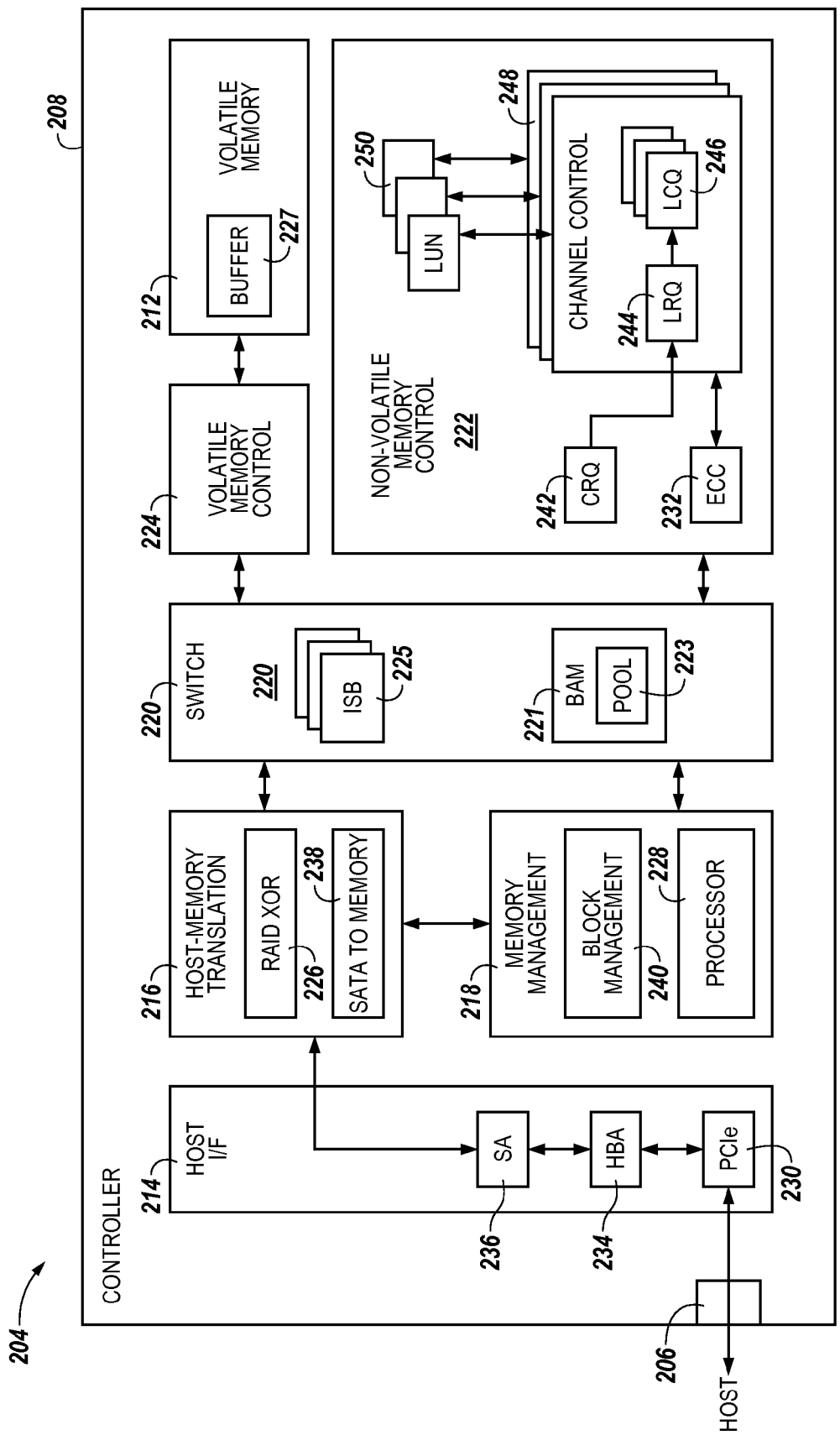
FIG. 2 is a functional block diagram of a memory system in accordance with a number of embodiments of the present disclosure.

FIG. 2 is a functional block diagram of a memory system 204 in accordance with a number of embodiments of the present disclosure. The memory system 204 can include solid state memory system controller 208. The solid state memory system controller 208 can be coupled to a number of solid state memory devices, e.g., solid state memory devices 110-1, . . . , 110-N illustrated in FIG. 1. In the example shown in FIG. 2, the number of memory devices include non-volatile memory including a number of logical units (LUNs) 250 and the controller 208 includes volatile memory 212. A LUN 250 can be a portion of non-volatile memory that can be independently controllable. Memory system 204 and solid state memory system controller 208 can be analogous to memory system 104 and solid state memory system controller 108 respectively, illustrated in FIG. 1.

The solid state memory system controller 208 can include host interface (I/F) circuitry 214 for interfacing with a host, e.g., host 102 illustrated in FIG. 1, via physical host interface 206. The solid state memory system controller 208 can include host-memory translation circuitry 216, memory management circuitry 218, a switch 220, non-volatile memory control circuitry 222, and/or volatile memory control circuitry 224. As described herein, the solid state memory system controller 208 can be provided in the form of an ASIC, however, embodiments are not so limited.

The host I/F circuitry 214 can be coupled to host-memory translation circuitry 216. The host I/F circuitry 214 can be coupled to and/or incorporated with a physical interface to a host, such as physical interface 206. The host I/F circuitry 214 can interface with a host, e.g., host 102 in FIG. 1. The host I/F circuitry 214 can include a peripheral component interconnect express (PCIe) circuit 230 providing a physical layer, link layer, and transport or transaction layer interface, e.g., where the host is configured to transmit information according to a PCIe standard. A transport layer according to a serial advanced technology attachment (SATA) standard and/or a serial attachment SCSI (SAS) standard can be analogous to a transaction layer according to a PCIe standard. The PCIe circuit 230 can be coupled to a host bus adapter (HBA) 234, e.g., an advanced host controller interface (AHCI) compatible HBA. The HBA 234 can be coupled to an SA compliant device 236, which can be coupled to the host-memory translation circuitry 216.

In general, the host I/F circuitry 214 is responsible for converting command packets received from the host, e.g., from a PCIe bus, into command instructions for the host-memory translation circuitry 216 and for converting host-memory translation responses into host commands for transmission to the requesting host. For example, the host I/F circuitry 214 can construct SA command packets from PCIe based transaction layer packets. The HBA 234 and SA compliant device 236 are described in more detail with respect to FIGS. 3A-3B below.

The host-memory translation circuitry 216 can be coupled to the host I/F circuitry 214, to the memory management circuitry 218, and/or to the switch 220. The host-memory translation circuitry 216 can be configured to translate host addresses to memory addresses, e.g., addresses associated with a received command such as a read and/or write command. For example, such translation may be performed by SATA to memory circuitry 238. Although identified as "SATA to memory" circuitry 238, the circuitry can be configured for other serial attachments such as SAS, as described herein. The host-memory translation circuitry 216 might, for example, convert host sector read and write operations to commands directed to specific LUNs 250. The host-memory translation circuitry 216 can include error detection/correction circuitry, such as RAID exclusive or (XOR) circuitry 226. The RAID XOR circuitry 226 can calculate parity information based on information received from the host I/F circuitry 214.

The memory management circuitry 218 can be coupled to the host-memory translation circuitry 216 and to the switch 220. The memory management circuitry 218 can control a number of memory operations including but not limited to initialization, wear leveling, e.g., garbage collection and/or reclamation, and/or error detection/correction. While the memory management circuitry 218 can include a processor 228, a number of embodiments of the present disclosure provide for control of memory operations in circuitry, e.g., hardware, without relying on the execution of instructions, e.g., software and/or firmware, by the processor 228. Such embodiments can provide for faster memory operations relative to some previous approaches that rely more heavily on a processor to control memory operations. Memory management circuitry 218 can include block management circuitry 240, which is described in more detail with respect to FIG. 4.

The switch 220 can be coupled to the host-memory translation circuitry 216, the memory management circuitry 218, the non-volatile control circuitry 222, and/or the volatile memory control circuitry 224. The switch 220 can be a crossbar switch and can include and/or be coupled to a number of buffers. For example, the switch 220 can include internal static random access memory (SRAM) buffers (ISBs) 225. The switch can be coupled to a plurality of dynamic random access memory (DRAM) buffers 227 included in the volatile memory 212. The switch can include a buffer allocation management (BAM) circuit 221, which can include a buffer tag pool 223. The switch 220 can provide an interface between various components of the solid state memory system controller 208. The switch 220 can account for variations in defined signaling protocols that may be associated with different components of the solid state memory system controller 208 in order to provide consistent access and implementation between components. In a number of embodiments, the switch 220 can be a direct memory access (DMA) module.

The plurality of tags in the buffer tag pool 223 in the BAM circuit 221 can each identify a respective one of the plurality of DRAM buffers 227 or the plurality of ISBs 225. When a particular tag points to a DRAM buffer 227, a programmable "BAR" address can be appended to the buffer tag to fill out the address for the volatile memory 212. The BAM circuit 221 can be configured to allocate a tag to one of a number of hardware masters in response to an allocation request from the one of the number of hardware masters. Hardware masters can include those hardware components that can access memory.

The BAM circuit 221 can be configured to prioritize allocation of a tag identifying one of the plurality of ISBs 225 over a tag identifying one of the plurality of DRAM buffers 227. The ISBs 225 can be faster and lower powered than the DRAM buffers 227, and therefore preferable thereto. Thus, the BAM circuit 221 can be configured to prioritize allocation of tags such that a tag identifying one of the plurality of DRAM buffers 227 is allocated only after all tags identifying ISBs 225 have been allocated. In a number of embodiments, the solid state memory system controller 208 can include 768 DRAM buffers 227 and 256 ISBs 225 for a total of 1024 buffers. In such embodiments, the buffer tags can be 10-bit tags that identify one of the 1024 buffers. The buffer tag may have no particular meaning to the hardware master, but is passed along by the hardware master during the processing of commands, e.g., read and/or write commands, to allow the correct buffer to be referenced. The number of hardware masters can be configured to request allocation of a tag generically without requesting allocation of a tag specific to one of the plurality of ISBs 225 or one of the plurality of DRAM buffers 227. In a number of embodiments, each of the DRAM buffers 227 and the ISBs 225 can be of a size equal to a size of the largest supported memory page, e.g., 4 KB.

The BAM circuit 221 can be configured to remove tags from the buffer pool 223 that are associated with non-functioning buffers. The processor 228 can be configured to access the BAM circuit 221 and remove tags from the buffer pool 223 that are associated with non-functioning buffers. Such embodiments can help the solid state memory system controller 208 to function properly even if one or more ISBs 225 fail. In some embodiments, the ability to remove, e.g., "map out," "bad" buffers can be used in lieu of testing ISBs 225 during manufacturing. The switch 220 may be "over-provisioned" with ISBs 225 such that losing a number of the ISBs 225 does not does not noticeably affect operation of the solid state memory system controller 208.

The number of hardware masters can be configured to request allocation of a tag from the BAM circuit 221 in conjunction with a read command or a write command and to request deallocation of an allocated tag from the BAM circuit 221 in conjunction with completion of the read command or the write command. Hardware masters do not use the same tags for multiple commands and therefore request a new tag for each command. The hardware masters can be configured to prioritize deallocation requests over allocation requests, e.g., to help ensure that sufficient buffers, particularly ISBs 225, are available for multiple commands from multiple hardware masters.

The use of buffer tags can facilitate read operations. The hardware masters can be configured to send a read command to the non-volatile memory control circuitry 222 along with an allocated tag. The non-volatile memory control circuitry 222 can be configured to store information corresponding to the read command in a buffer identified by the allocated tag and to notify the particular hardware master that sent the read command that the information is ready.

The use of buffer tags can facilitate write operations. The hardware masters can be configured to send a write command to the non-volatile memory control circuitry 222 along with an allocated tag and to store information corresponding to the write command in a buffer identified by the allocated tag. The non-volatile memory control circuitry 222 can be configured to retrieve the information from the buffer identified by the allocated tag, write the information to non-volatile memory, e.g., to the appropriate LUN 250, and notify the hardware master that sent the write command that the information has been written.

The processor 228 in the memory management circuitry 218 can be a hardware master. The processor 228 can be configured to enable direct memory access (DMA) operations between the non-volatile memory control circuitry 222 and the volatile memory control circuitry 224 with access to the entire volatile memory 212 space without regard to the plurality of tags. Other hardware masters may not enable the DMA feature and therefore rely on tags for access to buffers rather than directly accessing the memory space. The processor 228 can enable DMA operations via information in a field used in conjunction with commands sent through the command pipeline that bypasses the need for a buffer to access memory space. For example, the information "DMA_En BARSEL" can be included in a field used with a command, where "DMA_En" indicates to the receiver that a DMA operation has been enabled, and where "BARSEL" indicates that an address should be included for the DRAM in lieu of a buffer tag, as described herein. Thus, the processor 228 can move information between the volatile memory 212 and the LUNs 250 using the same logic as buffer-based access for other hardware masters. The "DMA_En" can be echoed to the switch 220 by the channel control circuitry 248 when accessing a LUN 250. From the perspective of the channel control circuit 248, the DMA access is virtually identical to the buffer-based access. If "DMA_En" is asserted, the switch 220 can force the request to the volatile memory 212. The "BARSEL" is used by the switch 220 to swap a unique "BAR" analogous to the "BAR" address appended to the buffer tag when it points to a DRAM buffer 227. For example, the "BAR" address can be a two-bit address pointing to one of four locations, however embodiments are not so limited. Use of the "BAR" address can allow different simultaneous DMAs.

The non-volatile memory control circuitry 222 can be coupled to the switch 220. The non-volatile memory control circuitry 222 can be coupled to non-volatile memory devices. FIG. 2 shows the non-volatile memory devices including a number of LUNs 250. The number of LUNs 250 can be coupled to the non-volatile memory control circuitry 222 by a number of channels. In some embodiments, the number of channels can be controlled collectively by the non-volatile memory control circuitry 222. In a number of embodiments, each memory channel is coupled to a discrete channel control circuit 248, as illustrated in FIG. 2. A particular channel control circuit 248 can control and be coupled to more than one LUN 250 by a single channel. In a number of embodiments, the channel control circuits 248 can be coupled to a plurality of LUNs 250 by an Open NAND Flash Interface (ONFI) compliant bus.

The non-volatile memory control circuitry 222 includes at least a portion of a command pipeline where commands reside while waiting to be executed by a channel control circuit 248. All hardware masters that initiate requests to the LUNs 250 can share the same command pipeline through the switch 220. For read commands from a host (host reads), there is no control over which LUN 250 is accessed because the host needs particular information, which is stored in one or more LUNs 250. Likewise, there is no control over the volume of host traffic. The command pipeline described herein can provide flexibility in hiding program time, read time, and erase time conflicts between LUNs 250. For example, erase time may be longer than program time or read time. Each channel control circuit 248 may be coupled by a plurality of channels to a plurality of LUNs 250. Therefore, while an erase command is being executed by a particular channel control circuit 248 for a particular LUN, the particular channel control circuit 248 may execute another command for a different LUN 250 on the same channel.

The non-volatile memory control circuitry 222 can include a channel request queue (CRQ) 242 coupled to each of the channel control circuits 248. Each channel control circuit 248 can include a LUN request queue (LRQ) 244 coupled to a plurality of LUN command queues (LCQs) 246. The LRQ 244 can be an L-number-deep queue circuit, where L is equal to a number of LUNs 250 per channel control circuit 248. The CRQ 242 can be a C-number-deep queue circuit, where C is equal to, for example, x*(the plurality of channel control circuits 248), where x is a whole number, e.g., 4. For example, the non-volatile memory control circuitry 222 can include 32 channels with 16 LUNs per channel, one 128-deep CRQ 242 configured to store up to 128 entries for command storage shared between channels, one 16-deep LRQ 244 per channel configured to store up to 16 commands between the LUNs 250 on a particular channel, and a 2-deep LCQ 246 per channel, where the LCQ 246 is a first-in-first-out (FIFO) circuit. For example, the 2-deep FIFO can be configured to queue a current command and a next command to be executed subsequent to the current command. Such embodiments provide (512 LUNs*2-deep LCQ) for 1024 entries, plus (one 16-deep LRQ per channel*32 channels) for 512 entries, plus (one 128-deep CRQ) for a total of (1024+512+128)=1664 command storage entries. As described herein, such a command pipeline structure can provide the same performance as 524,288 command storage entries (32 LUNs per channel*16 channels*1024-deep FIFO per LUN=524,288) at a fraction of the size.

The CRQ 242 can be configured to receive a command from the switch 220 and relay the command to one of the LRQs 244, e.g., the LRQ 244 associated with the channel that is associated with the particular LUN 250 for which the command is targeted. The LRQ 244 can be configured to relay a first plurality of commands for a particular LUN 250 to the LCQ 246 associated with the particular LUN 250 in an order that the first plurality of commands were received by the LRQ 244. The command pipeline is structured such that commands to a same LUN 250 move in order, e.g., in the order that they were received by the LRQ 244. The LRQ 244 can be configured to queue a command for a particular LUN 250 in response to the LCQ 246 associated with the particular LUN 250 being full and the CRQ 242 can be configured to queue a command for a particular LRQ 244 in response to the particular LRQ 244 being full.

The LRQ 244 can be configured to relay a second plurality of commands for different LUNs 250 to the LCQs 246 associated with the different LUNs 250 in an order according to a status of the different LUNs 250. For example, the status of the different LUNs 250 can be a ready/busy status. The command pipeline is structured such that the commands between different LUNs 250 can move out of order, e.g., in an order different from the order in which they were received by the LRQ 244 according to what is efficient for overall memory operation at the time. For example, the LRQ 244 can be configured to relay a first one of the second plurality of commands to a first LCQ 246 before relaying the second one of the second plurality of commands to a second LCQ 246 in response to the status of the different LUN 250 associated with the second LCQ 246 being busy, where the first one of the second plurality of commands is received later in time than the second one of the second plurality of commands. The LRQ 244 can be configured to relay the second one of the second plurality of commands to the second LCQ 246 in response to the status of the LUN 250 associated with the second LCQ 246 being ready, e.g., subsequent to relaying the first one of the second plurality of commands.

A number of embodiments including discrete non-volatile memory channel control circuits for each channel can include discrete error detection/correction circuitry 232, e.g., error correction code (ECC) circuitry, coupled to each channel control circuit 248 and/or a number of error detection/correction circuits 232 that can be used with more than one channel. The error detection/correction circuitry 232 can be configured to apply error correction such as BCH error correction, as will be understood by one of ordinary skill in the art, to detect and/or correct errors associated with information stored in the LUNs 250. For example, the error detection/correction circuitry can provide 29 bits of error correction over a 1080-bit code word. The error detection/correction circuitry 232 can be configured to provide differing error correction schemes for single and/or multi level cell (SLC/MLC) operation.

The volatile memory control circuitry 224 can be coupled to the switch 220 and to the volatile memory 212, e.g., a number of volatile memory devices. Among other information, the number of volatile memory devices can store an LBA table and/or a block table as described in more detail with respect to FIG. 4.

Figure 3A:
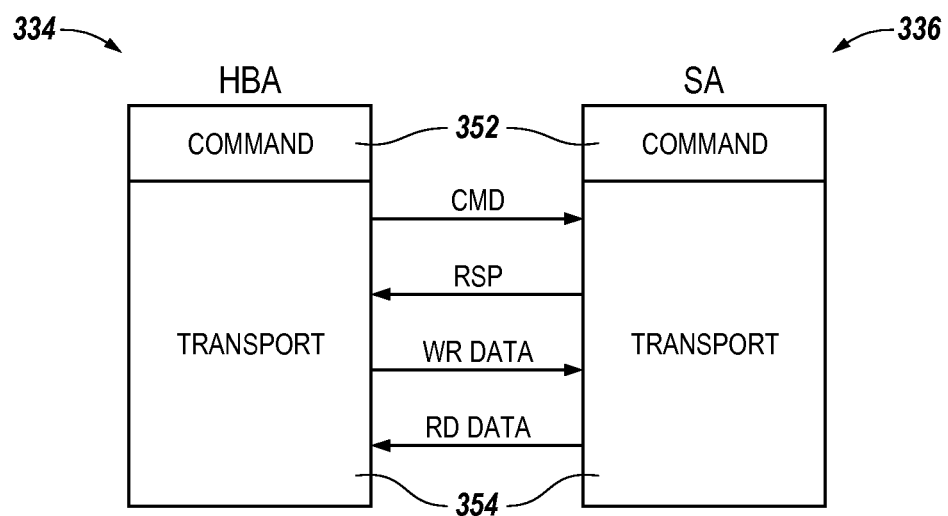
FIG. 3A is a functional block diagram of a transport layer interface between a host bus adapter (HBA) and a serial attachment (SA) programming compliant device in accordance with a number of embodiments of the present disclosure.

FIG. 3A is a functional block diagram of a transport layer interface between a host bus adapter (HBA) 334 and a serial attachment (SA) programming compliant device 336 in accordance with a number of embodiments of the present disclosure. The HBA 334 can be analogous to HBA 234 illustrated in FIG. 2. The SA programming compliant device 336 can be analogous to the SA programming compliant device 236 illustrated in FIG. 2. In a number of embodiments, the SA programming compliant device 336 can be a serial advanced technology (SATA) programming compliant device. In a number of embodiments, the SA programming compliant device 336 can be a serial attachment SCSI (SAS) programming compliant device.

SA protocols are conceptually defined using layers. In order from low to high, for SATA, these include the physical layer, the link layer, the transport layer, and the command layer. In order from low to high, for SAS, these include the physical layer, the PHY layer, the link layer, the port layer, the transport layer, and the application layer. Command layer and/or application layer information can be communicated on the transport layer by breaking commands up into frame information structures (FISes). According to some previous approaches, FISes were communicated on the link layer using primitives. Primitives were communicated on the physical layer using codewords, which were transmitted on a SATA or SAS cable using 8b10b encoding. Communication on the SATA or SAS cable consisted of two differential pairs of wires referenced from the host's perspective as transmit (Tx) and receive (Rx). These wires could transmit either commands or information, and were arbitrated for control. One limitation of this scheme is that once a communication is arbitrated on the cable, it is the only communication that occurs. That is, SATA or SAS is only capable of transmitting a single FIS at a given time.

If the HBA 334-SA programming compliant device 336 interface is entirely within the controller, e.g., as in the case of the solid state memory system controller 208 illustrated in FIG. 2, information flow is free from the constraints of a cable-connected SA physical layer. A number of embodiments of the present disclosure abandon use of the physical and link layers while preserving usage of the FISes and commands supported by the command layer 352 and the transport layer 354. Concurrency can be achieved by defining physical communication as four sets input/outputs, e.g., command (Cmd), response (Rsp), write data (WrData), and read data (RdData). Thus, by employing a function-specific interconnect, conflicts no longer exist between commands, responses, and information delivery. They can be pipelined and operate concurrently. That is, the function-specific interconnect can be configured to simultaneously transfer a command, a response, and information between the HBA 334 and the SA programming compliant device 336. The function-specific interconnect can include: a Cmd output on the HBA 334 coupled to a Cmd input on the SA programming compliant device 336, a Rsp output on the SA programming compliant device 336 coupled to a Rsp input on the HBA 334, a WrData output on the HBA 334 coupled to a WrData input on the SA programming compliant device 336, and a RdData output on the SA programming compliant device 336 coupled to a RdData input on the HBA 334. In a number of embodiments, each of the Cmd, Rsp, WrData, and RdData input/output pairs can be unidirectional and employ neither 8b10b encoding nor primitives.

The function-specific interconnect can be configured to operate a command interface (the Cmd output on the HBA 334 and the Cmd input on the SA programming compliant device 336), a response interface (the Rsp input on the HBA 334 and the Rsp output on the SA programming compliant device 336), and an information interface (the WrData output on the HBA 334 and the WrData input on the SA programming compliant device 336 and/or the RdData input on the HBA 334 and the RdData output on the SA programming compliant device 336) concurrently in response to a first command protocol, e.g., native command queuing (NCQ) and/or tagged command queuing (TCQ), among others. The function-specific interconnect can be configured to operate the command interface, response interface, and the information interface atomically in response to a second command protocol, e.g., NonData, programmed input/output (PIO), and/or direct memory access (DMA), among others.

The command interface can be used to deliver host-device (HD) FISes from the HBA 334 to the SA programming compliant device 336. The WrData output on the HBA 334 can be used to deliver information to the WrData input on the SA programming compliant device 336. The RdData output on the SA programming compliant device 336 can be used to deliver information to the RdData input on the HBA 334. The response interface can be used to qualify information delivery, e.g., using PIOSetups, DMAActivates, DMASetups, etc., and communicate completions, e.g., device-host (DH) and/or set device bits (SDB), etc. Qualifying information delivery can include defining an order in which information is delivered. The use of buffering can allow the movement of information to begin prior to the corresponding response FIS.

Figure 3B:
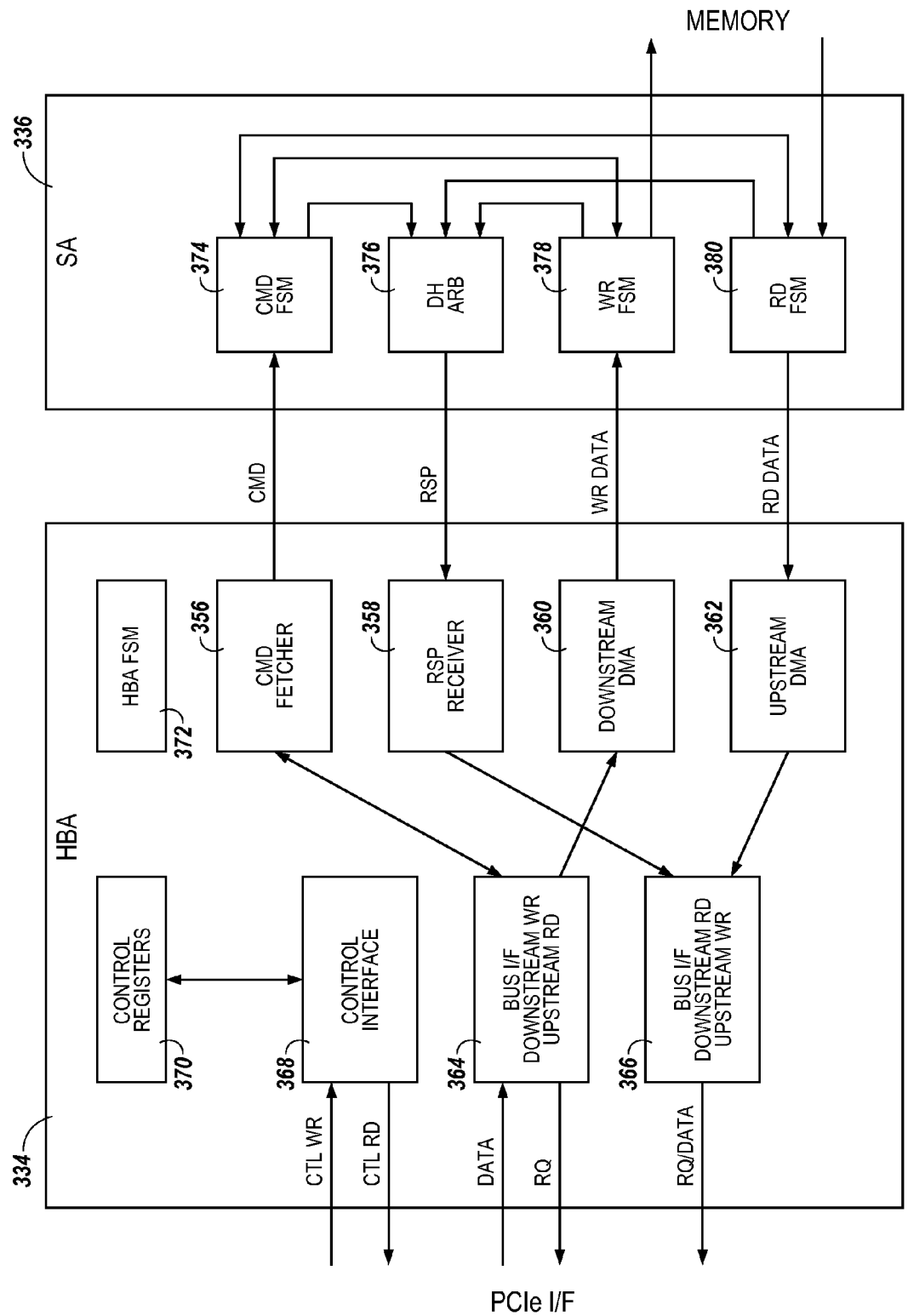
FIG. 3B is a functional block diagram of an HBA and an SA programming compliant device in accordance with a number of embodiments of the present disclosure.

FIG. 3B is a functional block diagram of an HBA 334 and an SA programming compliant device 336 in accordance with a number of embodiments of the present disclosure. The HBA 334 can be analogous to HBA 234 illustrated in FIG. 3A, with more detail shown. The SA programming compliant device 336 can be analogous to the SA programming compliant device 236 illustrated in FIG. 3A, with more detail shown.

The HBA 334 can include a command fetcher 356 providing the Cmd output to the SA programming compliant device 336. The HBA 334 can include a response receiver 358 receiving the Rsp input from the SA programming compliant device 336. The HBA 334 can include a downstream DMA device 360 providing the WrData output to the SA programming compliant device 336. The HBA 334 can include an upstream DMA device 362 receiving the RdData input from the SA programming compliant device 336. Each of the Cmd fetcher 356, the Rsp receiver 358, the downstream DMA 360, and the upstream DMA 362 can be hardware components that can operate independently of each other, but, in a number of embodiments, can synchronize operation with the HBA FSM 372, e.g., an advanced host controller interface (AHCI) state machine so that AHCI protocol can be enforced.

The downstream DMA device 360 and the Cmd fetcher 356 can be coupled to a bus interface (I/F) 364 for downstream writes and/or upstream reads. The bus I/F 364 can be configured to receive requests from the Cmd fetcher 356, pass along the requests to the PCIe I/F, e.g., an interface with PCIe circuit 230 illustrated in FIG. 2, and return replies to the Cmd fetcher 356 when appropriate. The bus I/F 364 can also be configured to receive information from the PCIe I/F and send requests, e.g., write information fetches, thereto. The downstream DMA device 360 can be configured to pipeline multiple PCIe read requests via the Bus I/F 364 when adequate buffering exists to receive the write information. Each request sent via the Bus I/F 364 to the PCIe I/F can cause assignment of a rotating buffer tag that directs information from the PCIe I/F to the respective write buffer. Information can then be removed from the write buffers in a rotating fashion to be sent to the SA programming compliant device 336. The Rsp receiver 358 and the upstream DMA device 362 can be coupled to a bus I/F 366 for downstream reads and/or upstream writes. The bus I/F 366 can be configured to transmit information and/or requests via the PCIe I/F.

The HBA 334 architecture can present a single AHCI port to host device driver software, but can extend the number of command slots within the port, e.g., to 256. Proprietary host device drivers can access the slots by control registers 370, e.g., eight 32-bit command-issue registers. The control registers 370 may be connected to the PCIe I/F via control interfaces 368 for input of write control information and output of read control information. In a number of embodiments, the Cmd fetcher 356 can retrieve and forward commands to the SA programming compliant device 336 in an order that the commands are issued. A number of commands, e.g., 32 commands, can be received simultaneously within the control registers 370 and enqueued for the Cmd fetcher 356.

The number of command slots can be grouped into command slot groups and have a message signaled interrupt (MSI), e.g., MSI-X, vector assigned thereto. Such embodiments can be beneficial versus some previous approaches that include 32b AHCI registers for commands for multiple ports. A number of embodiments of the present disclosure include one port with 256b registers for commands, which can make command grouping with MSI vectors advantageous, such as to improve a likelihood that interrupt performance can be optimized in the host, e.g., host 102 illustrated in FIG. 1.

The HBA 334 can use context arrays for NCQ reads to be returned in an interleaved fashion. The information within a particular read command processes in order, however portions of multiple outstanding read commands may be interleaved with each other. When a read context is initiated by the SA programming compliant device 336, the HBA 334 can retrieve a record of the current status of the read command from the context arrays and continue from the point it was last discontinued. When the read context is completed, the HBA 334 can store the updated command progress values in the context arrays. A context array location can exist for each possible outstanding read command, e.g., 256 outstanding read commands. An analogous context array may be used for writes.

The SA programming compliant device 336 can include a command finite state machine (FSM) 374 receiving the Cmd input from the HBA 334, e.g., the command fetcher 356 of the HBA 334. The SA programming compliant device 336 can include a device-host arbiter (DH ARB) 376 providing the Rsp output to the HBA 334, e.g., the response receiver 358 of the HBA 334. The SA programming compliant device 336 can include a write FSM 378 receiving the WrData input from the HBA 334, e.g., the downstream DMA 360 of the HBA 334. The SA programming compliant device 336 can include a read FSM 380 providing the RdData output to the HBA 334, e.g., the upstream DMA 362 of the HBA 334. The Wr FSM 378 can provide an output to memory, and the Rd FSM 380 can provide an input from memory, e.g., via the host-memory translation circuitry 216 illustrated in FIG. 2.

The DH ARB 376 can have an input from the Cmd FSM 374, e.g., for communication of DHs, SDBs, etc. The DH ARB 376 can include an input from the Wr FSM 378, e.g., for write DMASetups. The DH ARB 376 can include an input from the Rd FSM 380, e.g., for read DMASetups. The DH ARB 376 can be configured to qualify an order of information delivery and communicate completions to the HBA 334 based on the input from the Cmd FSM 374, the Wr FSM 378, and the Rd FSM 380. The Wr FSM 378 can include a write buffer configured to buffer write information before the DH ARB 376 qualifies the order of write information delivery. The Rd FSM 380 can include a read buffer configured to buffer read information before the DH ARB 376 qualifies the order of read information delivery.

In a number of embodiments, the Cmd FSM 374 can be configured to operate concurrently by default. The Cmd FSM 374 can be configured to operate atomically, e.g., in "CurrencyDisabled" mode, in response to detection of a single-context command protocol such as PIO or DMA. When operating atomically, the Cmd FSM 374 can be configured to assert one of two "PassControl" signals, one to the Wr FSM 378 and one to the Rd FSM 380. Subsequently, the Cmd FSM 374 can enter a "WaitForCtl" state until a reset command is received or a "RetrunControl" signal is asserted from either the Wr FSM 378 or the Rd FSM 380. If the detected protocol is NonData, then neither PassControl signal is asserted. The Cmd FSM 374 can service the command itself and return to idle upon completion. If logic indicates that command tags are ready to be retired, the Cmd FSM can generate an appropriate SDB FIS and return to idle.

In a number of embodiments, the Wr FSM 378 and the Rd FSM 380 can be configured to operate concurrently by default. The Wr FSM 378 and the Rd FSM 380 can be configured to operate atomically on receipt of the PassControl signal from the Cmd FSM 374 and/or detection of a single-context command protocol such as PIO or DMA. The Wr FSM 378 and/or the Rd FSM 380 can operate atomically following the SA protocol, e.g., SATA protocol or SAS protocol, until either a command count is completed or an error condition is met, in which case the respective FSM can assert its RtnCtl signal, which can release the Cmd FSM 374 from its WaitForCtl state. Conversely, concurrent operation allows each FSM to move information independently.

Figure 4:
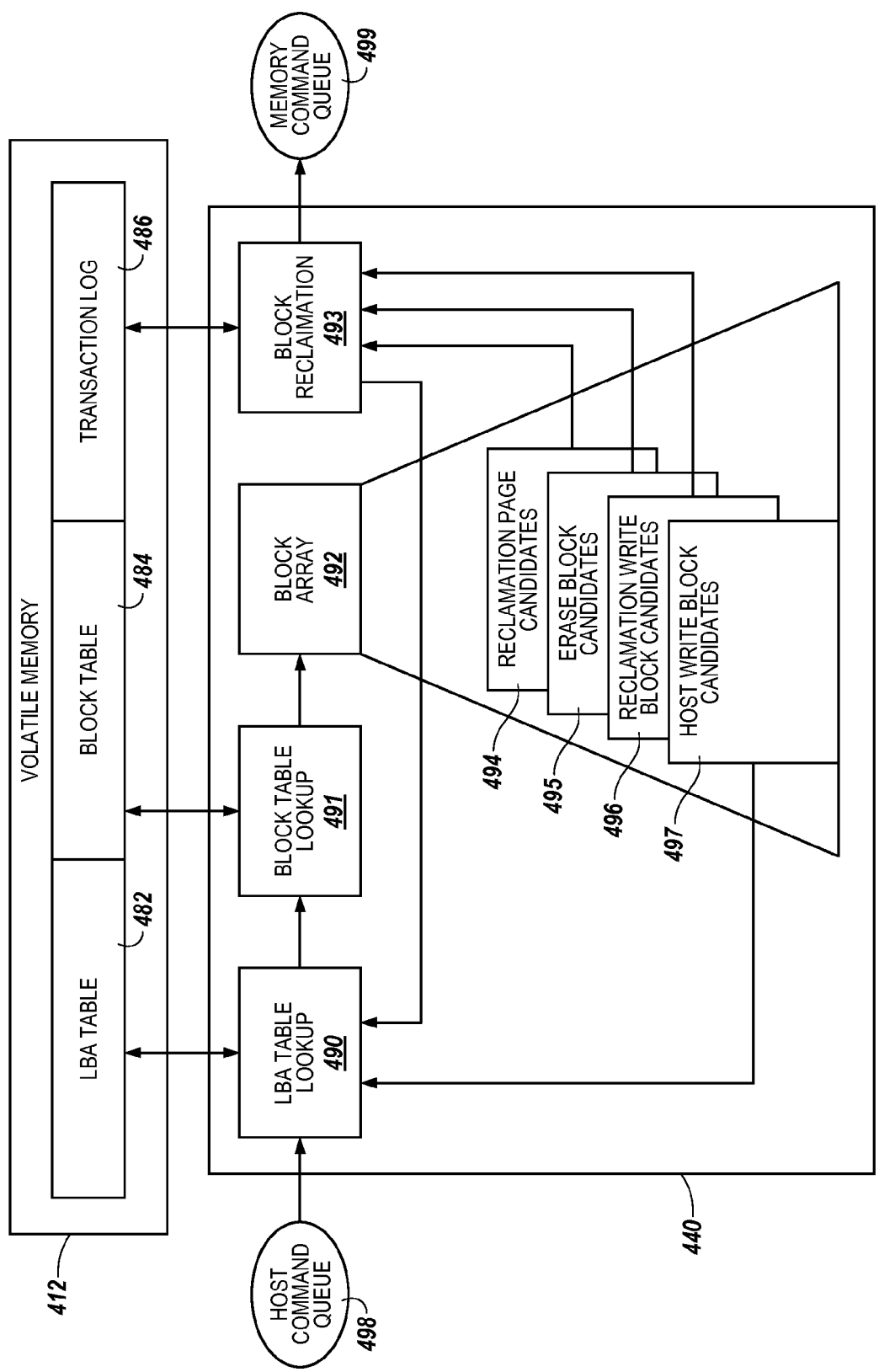
FIG. 4 illustrates a functional block diagram of a block management device in accordance with a number of embodiments of the present disclosure.

FIG. 4 illustrates a functional block diagram of a block management device 440 in accordance with a number of embodiments of the present disclosure. The block management device 440 can be analogous to the block management device 240 illustrated in FIG. 2 and can be included in memory management circuitry. The block management device 440 can communicate with volatile memory 412, e.g., DRAM, which can be analogous to the volatile memory 212 illustrated in FIG. 2. Thus, for example, the block management device 440 can communicate with the volatile memory 412 via a switch and volatile memory control circuitry. The volatile memory 412 can store a logical block address (LBA) table 482, a block table 484, and/or a transaction log 486, among other information.

The LBA table 482 can store the physical page address of pages in the LUNs, e.g., LUNs 250 illustrated in FIG. 2, and include corresponding logical addresses. That is, the LBA table 482 can store logical to physical and/or physical to logical address translations. Thus, the LBA table 482 can be used to look-up physical page addresses that correspond to logical block addresses where corresponding information can be stored. The LBA table 482 can be indexed by the LBA that is contained in an associated SA command. The block table 484 can store information for erasable blocks in the number of LUNs. Information stored in the block table 484 can include valid page information, erase count, and other health and/or status information. Information accessed from the block table 484 can be indexed by physical block address. The transaction log 486 can be used to record information about writes that occur in the LUNs. In a number of embodiments, the transaction log 486 can be updated contemporaneously with the writes to the LUNs. The transaction log 486 can include information about writes to the LUNs that have occurred since the last time that the LBA table 482 was saved in the non-volatile memory, e.g., in order to facilitate recreation of portions of the LBA table 482 that may be lost due to sudden power loss or other errors between updates of the LBA table 482 to the non-volatile memory.

Some of the objects depicted within the block management device 440 are indicative of the functionality provided by the block management device 440. The LBA table lookup function 490 can reference the LBA table 482 in the volatile memory 412 to perform logical to physical address translation. The LBA table lookup function 490 can update the LBA table 482 with a new physical address corresponding to a logical address when information associated with the logical address is updated. The block table lookup function 491 can reference the block table 484 in the volatile memory 412, e.g., to determine candidates for wear leveling such as reclamation and/or garbage collection. Reclamation can involve moving all valid pages from a block to be erased to new locations before the block is erased. The block reclamation function 493 can reference the transaction log 486 in the volatile memory 412.

The block array 492 stored in local memory of the memory management circuitry, e.g., block management device 440, can track reclamation page candidates 494, erase block candidates 495, reclamation write block candidates 496, and/or host write block candidates 497, e.g., as referenced to the block array 492 by the LBA table lookup function 490 and/or the block table lookup function 491. Such candidates can be selected for each LUN in the system using dedicated hardware to analyze the health and/or status information of each block as it is read or written to the volatile memory 412, e.g., DRAM, at volatile memory speed. The current candidates for each LUN can be stored in the block array 492. Each time the block table 484 is accessed, a pipelined structure can retrieve the current best candidate from the block array 492 and compare it to the new block table 484 access. If the new block table 484 access, e.g., as a result of a write, erase, or error event, reveals a better candidate than the current candidate stored in the block array 492, then the new block can replace that candidate in the block array 492. Candidate selection can occur without stalling access to the volatile memory 412, which allows the process to proceed at volatile memory 412 speed using the pipelined structure.

The block management device 440 can be configured to store health and status information for each of a plurality of blocks in a block table 484 in the volatile memory 412. The block management device 440 can be configured to store a candidate block table, e.g., block array 492 including reclamation page candidates 494, erase block candidates 495, reclamation write block candidates 496, and/or host write block candidates 497, in the local memory. The candidate block table can identify a candidate block for a particular operation, e.g., a host write, a reclamation read, a reclamation write, and/or an erase, based on a number of criteria for the particular operation. The block management device 440 can be configured to update the health and status information for a particular block in the block table 484, e.g., in response to a write, an erase, or an error event for the particular block. The block management device 440 can be configured to compare the updated health and status information for the particular block with the candidate block according to the number of criteria. The block management device 440 can be configured to update the candidate block table to identify the particular block at least partially in response to the comparison indicating that the particular block better satisfies the number of criteria, e.g., on a same clock cycle during which the health and status information for the particular block is updated in the volatile memory 412.

The candidate selection process described above can be supplemented with a table walking process that does not rely on a new block table 484 access as a result of a write, erase, or error event, for example. The table walking process can recover the history of block information that is not stored locally in the block array 492 in the block management device 440. Table walking can be a slower background process relative to block table 484 accesses as a result of a write, erase, or error event. Once the entire block table 484 has been walked, the table walking process may be ceased, e.g., to reduce volatile memory 412 power consumption. In some instances, a new block table 484 access can reinitiate the table walking process. Thus, the block management device 440 can be configured to compare the updated health and status information for each of the plurality of blocks in the block table 484 in the volatile memory 412 with the candidate block according to the number of criteria independent of a write, an erase, or an error event for any of the plurality of blocks. The comparison of the blocks can be ceased after each of the plurality of blocks has been compared.

In a number of embodiments of the present disclosure, host operations are not stalled during a reclamation process according to the use of a coherency point to update the LBA table 482. During a reclamation process, a reclamation page candidate, e.g., from reclamation page candidates 494, is read from a first location and written to a second location. During this read and write, the host may have written new information to the LBA currently being processed for reclamation and updated the LBA table 482 with a new physical address. When the reclamation has finished the page read and write, the LBA table 482 can be updated with the new physical address only if the LBA table 482 entry for the LBA under reclamation has the same physical address as the information read from the first location, e.g., if the host has not updated the entry in the LBA table 482. The page corresponding to the reclamation read can be marked as invalid, e.g., storing stale information, in the block table 484. If the physical address is different than the address corresponding to the reclamation read, that indicates that the host has made an update, and the LBA table will not be updated with the new physical address per the reclamation write. The reclamation write can be invalidated in the block table 484 to indicate that the physical location corresponding to the reclamation write stores invalid information.

The memory management circuitry, e.g., the block management device 440, can be configured to retrieve a first physical address corresponding to a logical address for a particular block from the block table 484 prior to information being read from the particular block during a reclamation operation on the particular block. The block management device 440 can be configured to retrieve a second physical address corresponding to the logical address from the LBA table 482 after the information is written to a different block during the reclamation operation. The block management device 440 can be configured to update the LBA table 482 with a third physical address corresponding to the different block at least partially in response to the second physical address being equal to the first physical address. The block management device 440 can be configured to invalidate the reclamation operation at least partially in response to the second physical address being different than the first physical address.

The block management device 440 can be coupled between a host command queue 498 and a memory command queue 499. The host command queue 498 can be associated with a host, such as host 102 illustrated in FIG. 1, SA to memory circuitry 238 as illustrated in FIG. 2, and/or a number of components of the host interface 214 illustrated in FIG. 2. The memory command queue 499 can be analogous to one or more of the CRQ 242, LRQ 244, and LCQs 246 illustrated in FIG. 2, and/or other components.

Memory management circuitry, e.g., the block management device 440, can be coupled to non-volatile memory control circuitry, e.g., non-volatile memory control circuitry 222 illustrated in FIG. 2 via a switch, e.g., switch 220 illustrated in FIG. 2. The memory management circuitry can be configured to allocate a write block cluster for host writes based on an information width of a host bus and a protocol of the host bus. A write block cluster can include a number of blocks from a number of LUNs 250. The host bus can be part of a host, e.g., host 102 illustrated in FIG. 1. For example, the host bus can be a PCIe bus with bus widths of x1, x2, x4, x8, x16, x32, etc., and protocols of PCIe generations 1-3, among others. The write block cluster can include one block from fewer than all of the LUNs that are coupled to a plurality of channel control circuits in the non-volatile memory control circuitry. In a number of embodiments, the memory management circuitry can be configured to limit the size of the write block cluster to a minimum number of the LUNs used to support a maximum host bus bandwidth according to the information width of the host bus and the protocol of the host bus.

The write bandwidth of the memory system controller can be a function of the maximum bandwidth supported by the host bus, the number of memory channels in the system, and the number of LUNs per channel. Allocating more LUNs than the host bus can support may be a waste of resources that could otherwise be used for reclamation operations. Thus, according to a number of embodiments of the present disclosure, the host write block cluster size can be limited to something less than the total number of LUNs in the memory system.

A remainder of blocks from the LUNs, e.g., those not allocated to the write block cluster, can be allocated for reclamation operations. Memory management circuitry can be configured to temporarily deallocate a number of the allocated LUNs from reclamation operations. The write block cluster can be allocated for host writes such that blocks of the write block cluster are written in a particular sequence of LUNs. Reclamation bandwidth may be limited to improve the write bandwidth of the memory system controller by suspending reclamation operations to LUNs that may be used for writes in the near future. At least one of the allocated LUNs can be deallocated from reclamation operations at least partially in response to the particular sequence of LUNs indicating that the LUN is within a threshold number of LUNs of being next in the particular sequence of LUNs for a host write. The threshold number can be different for each of a reclamation read operation, a reclamation write operation, and a reclamation erase operation. The threshold number can represent an "exclusion zone" that is a number of LUNs where no reclamation operations may occur prior to a write operation.

Using multiple LUNs per channel can lead to situations where more commands are issued than a particular channel can handle, leading to the commands being queued with respect to the memory channel, e.g., as described with respect to the CRQ 242, LRQ 244, and LCQs 246 in FIG. 2. The memory management circuitry can be configured to limit a number of commands issued for reclamation operations to a particular LUN at least partially in response to the number of queues associated with the particular LUN being within a threshold of being full. The maximum number of commands per channel may also be limited to stay within a desired power envelope. The number of commands issued for reclamation operations can be limited at least partially in response to an amount of power caused to be used by the memory system controller exceeding a threshold amount of power. The maximum number of commands per channel may also be limited, for example in order to help ensure that back-to-back commands for a same channel and/or LUN are spaced apart sufficiently for efficient operation. The memory management circuitry can be configured to enforce at least a minimum time, e.g., number of clocks, between issuance of a first command and a second command for reclamation operations. The minimum time can be based on a total number of erased blocks in the LUNs, e.g., because reclamation bandwidth can increase as the number of erased blocks decreases.

Maximum host write bandwidth can be maintained in the short-term if there is an adequate supply of erased blocks available. Once the supply of erased blocks is nearly consumed, write bandwidth can decrease due to increased reclamation operations. The memory management circuitry can be configured to track a number of erased blocks for reach of the LUNs, e.g., with reference to the block table 484. The memory management circuitry can be configured to engage reclamation operations for a particular LUN at least partially in response to the number of erased blocks in the particular LUN exceeding a reclamation threshold number, e.g., falling below the threshold number. The memory management circuitry can be configured to suspend reclamation operations for a particular LUN at least partially in response to the number of erased blocks in the particular LUN exceeding a reclamation threshold number, e.g., going over the threshold number. Host writes can be suspended for the particular LUN at least partially in response to the number of erased blocks in the particular LUN falling below a host write threshold number. The memory management circuitry can be configured to suspend writes to a particular LUN at least partially in response to the number of erased blocks in the particular LUN exceeding a write threshold number, e.g., falling below the threshold number. The memory management circuitry can be configured to re-engage writes to a particular LUN at least partially in response to the number of erased blocks in the particular LUN exceeding a reclamation threshold number, e.g., going over the threshold number. Such embodiments can help provide an equilibrium between reclamation operations and write operations, e.g., dynamic load balancing.

Some memory operations have long durations. The channel control circuits, e.g., channel control circuits 248 illustrated in FIG. 2 can include polling logic configured to issue a status read to the LUNs, e.g., to determine when a particular memory operation is complete. In some instances, such polling can interfere with other commands using the same channel as a LUN being polled. According to a number of embodiments of the present disclosure, the polling logic can be idled for a particular time according to a type of operation indicated by a command issued to a LUN. The idle time can be set for specific operations, e.g., according to a time that the particular operation is expected to take, such as a read, a write, and/or an erase operation, among others.

CONCLUSION

The present disclosure includes examples of various apparatus, including memory system controllers. One such memory system controller can include a switch and non-volatile memory control circuitry coupled to the switch. The non-volatile memory control circuitry can include a channel control circuit coupled to logical units. The channel control circuitry can be configured to relay an erase command to a first one of the logical units and relay a particular command from the switch to a second one of the logical units while the erase command is being executed on the first one of the plurality of logical units.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of a number of the associated listed items.

As used herein, the term "and/or" includes any and all combinations of a number of the associated listed items. As used herein the term "or," unless otherwise noted, means logically inclusive or. That is, "A or B" can include (only A), (only B), or (both A and B). In other words, "A or B" can mean "A and/or B" or "one or more of A and B."

It will be understood that, although the terms first, second, third, etc. may be used herein to describe various elements, these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a switch internal to the apparatus and coupled to a host interface internal to the apparatus; and
    non-volatile memory control circuitry internal to the apparatus and coupled to the switch, wherein the non-volatile memory control circuitry includes a channel request queue (CRQ) coupled to a plurality of channel control circuits, which are coupled to a plurality of logical units;
    wherein each of the channel control circuits includes:
        a plurality of logical unit command queues (LCQs); and
        a logical unit request queue (LRQ) coupled to the plurality of LCQs;
    wherein each of the channel control circuits is configured to relay a respective erase command to a first one of the plurality of logical units; and
    wherein the CRQ is configured to receive a particular command from the host interface via the switch and relay the particular command to a second one of the plurality of logical units via one of the LRQs while the respective erase command is being executed on the first one of the plurality of logical units.

2. The apparatus of claim 1, wherein each of the LRQs is configured to:
    relay a first plurality of commands for a particular one of the plurality of logical units to one of the plurality of LCQs associated with the particular one of the plurality of logical units in an order that the first plurality of commands were received; and
    relay a second plurality of commands for different ones of the plurality of logical units to those of the LCQs associated with the different ones of the plurality of logical units in an order according to a status of the different logical units.

3. The apparatus of claim 2, wherein the non-volatile memory control circuitry includes:
    a plurality of channel control circuits, each coupled to a separate plurality of logical units.

4. The apparatus of claim 2, wherein the LRQ is configured to relay the erase command to a first one of the plurality of LCQs associated with the first one of the plurality of logical units and to relay the particular command to a second one of the plurality of LCQs associated with the second one of the plurality of logical units.

5. The apparatus of claim 1, wherein the particular command is one of a read command and a write command.

6. A method, comprising:
    relaying, with a channel control circuit that includes a plurality of logical unit command queues (LCQs) and a logical unit request queue (LRQ) coupled to the plurality of LCQs, an erase command to a first one of a plurality of logical units;
    receiving, with a channel request queue (CRQ) coupled to a plurality of channel control circuits, including the channel control circuit, a particular command from a host via a switch internal to an apparatus, wherein the switch is coupled to a host interface internal to the apparatus and to non-volatile memory control circuitry the includes the CRQ and the plurality of channel control circuits; and
    relaying the particular command, with the CRQ, to a second one of the plurality of logical units via one of the LRQs while the erase command is being executed on the first one of the plurality of logical units.

7. The method of claim 6, wherein the method includes:
    relaying a first plurality of commands for a particular one of the plurality of logical units to one of a plurality of logical unit command queues (LCQs) associated with the particular one of the plurality of logical units in an order that the first plurality of commands were received; and
    relaying a second plurality of commands for different ones of the plurality of logical units to those of the LCQs associated with the different ones of the plurality of logical units in an order according to a status of the different logical units.

8. The method of claim 6, wherein the method includes relaying the erase command from memory management circuitry.

9. The method of claim 8, wherein the method includes receiving the particular command from a host.

10. A method, comprising:
    receiving a first plurality of commands for a particular logical unit of a plurality of logical units from a host via a switch at a channel request queue (CRQ) coupled to a plurality of channel control circuits, which are coupled to the plurality of logical units, wherein the CRQ and the plurality of channel control circuits are included in the non-volatile memory control circuitry coupled to the switch;
    receiving the second plurality of commands for different logical units of the plurality of logical units from the host via the switch at the CRQ;

relaying the first plurality of commands via a logical unit request queue (LRQ) to one of a plurality of logical unit command queues (LCQs) associated with the particular logical unit in an order that the first plurality of commands were received, wherein the LRQ and the plurality of LCQs are included in one of the plurality of channel control circuits; and relaying the second plurality of commands for different logical units via the LRQ to those of the plurality of LCQs associated with the different logical units in an order according to a status of the different logical units.

11. The method of claim 10, wherein the status of the different logical units is a ready/busy status, and wherein the method includes:

relaying a first one of the second plurality of commands to a first LCQ before relaying the second one of the second plurality of commands to a second LCQ in response to the status of the different logical unit associated with the second LCQ being busy, wherein the first one of the second plurality of commands is received later in time than the second one of the second plurality of commands; and relaying the second one of the second plurality of commands to the second LCQ in response to the status of the associated different logical unit being ready.

12. An apparatus, comprising:
a switch; and
non-volatile memory control circuitry coupled to the switch, wherein the non-volatile memory control circuitry includes:
  a plurality of channel control circuits, wherein each of the plurality of channel control circuits include:
    a plurality of logical unit command queues (LCQs); and
    a logical unit request queue (LRQ) coupled to the plurality of LCQs, wherein the LRQ is configured to:
      relay a first plurality of commands for a particular logical unit to one of the plurality of LCQs associated with the particular logical unit in an order that the first plurality of commands were received; and
      relay a second plurality of commands for different logical units to those of the LCQs associated with the different logical units in an order according to a status of the different logical units; and
  a channel request queue (CRQ) coupled to the plurality of channel control circuits, wherein the CRQ is configured to receive the second plurality of commands from a host via the switch and relay the command to one of the LRQs.

13. The apparatus of claim 12, wherein:
the status of the different logical units is a ready/busy status of the different logical units; and
the LRQ is configured to relay a first one of the second plurality of commands to a first LCQ before relaying the second one of the second plurality of commands to a second LCQ in response to the status of the different logical unit associated with the second LCQ being busy, wherein the first one of the second plurality of commands is received later in time than the second one of the second plurality of commands.

14. The apparatus of claim 13, wherein the LRQ is configured to relay the second one of the second plurality of commands to the second LCQ in response to the status of the associated different logical unit being ready.

15. The apparatus controller of claim 12, wherein each channel control circuit is configured to be coupled to a plurality of logical units by an Open NAND Flash Interface (ONFI) compliant bus.

16. The apparatus of claim 13, wherein each of the plurality of LCQs comprises a 2-deep first-in-first-out (FIFO) circuit configured to queue a current command and a next command to be executed subsequent to the current command, and wherein each of the plurality of LCQs is configured to be coupled to a different logical unit.

* * * * *